United States Patent
Cui et al.

(10) Patent No.: US 10,224,467 B2
(45) Date of Patent: Mar. 5, 2019

(54) METHODS FOR PRODUCING A PLURALITY OF CONVERSION ELEMENTS, CONVERSION ELEMENT AND OPTOELECTRONIC COMPONENT

(71) Applicant: OSRAM Opto Semiconductors GmbH, Regensburg (DE)

(72) Inventors: Hailing Cui, Regensburg (DE); Norwin Von Malm, Nittendorf (DE); Britta Goeoetz, Regensburg (DE); Robert Schulz, Thalmassing (DE); Dominik Schulten, Kelheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/318,331

(22) PCT Filed: Jun. 10, 2015

(86) PCT No.: PCT/EP2015/062964
§ 371 (c)(1),
(2) Date: Dec. 12, 2016

(87) PCT Pub. No.: WO2015/189285
PCT Pub. Date: Dec. 17, 2015

(65) Prior Publication Data
US 2017/0125648 A1    May 4, 2017

(30) Foreign Application Priority Data
Jun. 13, 2014 (DE) .................. 10 2014 108 362

(51) Int. Cl.
*H01L 33/50* (2010.01)
*H01L 25/075* (2006.01)
*H01L 33/48* (2010.01)

(52) U.S. Cl.
CPC ........ *H01L 33/505* (2013.01); *H01L 25/0753* (2013.01); *H01L 33/502* (2013.01);
(Continued)

(58) Field of Classification Search
CPC ......... H01L 25/0753; H01L 2933/0033; H01L 2933/0041; H01L 33/483; H01L 33/502; H01L 33/505
See application file for complete search history.

(56) References Cited

U.S. PATENT DOCUMENTS 6,198,220 B1 * 3/2001 Jones .................. H01L 51/5256
257/100
2007/0031685 A1    2/2007 Ko et al.
(Continued)

FOREIGN PATENT DOCUMENTS

CN    102272517 A    12/2011
CN    102903705 A    1/2013
(Continued)

*Primary Examiner* — Tucker J Wright
(74) *Attorney, Agent, or Firm* — McDermott Will & Emery LLP

(57) ABSTRACT

A method for producing a plurality of conversion elements (10) is specified, comprising providing a carrier substrate (1), introducing a converter material (3) into a matrix material (2), applying the matrix material (2) with the converter material (3) to individual regions (8) of the carrier substrate (1) in a non-continuous pattern, applying a barrier substrate (5) to the matrix material (2) and to the carrier substrate (1), and singulating the carrier substrate (1) with the matrix material (2) and the barrier substrate (5) into a plurality of conversion elements (10) along singulation lines (V), wherein the conversion elements (10) in each case comprise at least one of the regions (8) of the matrix material (2).

8 Claims, 7 Drawing Sheets

(52) U.S. Cl.
 CPC .... *H01L 33/483* (2013.01); *H01L 2933/0033* (2013.01); *H01L 2933/0041* (2013.01)

(56) References Cited

U.S. PATENT DOCUMENTS

| | | | |
|---|---|---|---|
| 2007/0228947 A1* | 10/2007 | Tanimoto | F21K 9/00 313/506 |
| 2008/0111145 A1 | 5/2008 | Lin | |
| 2010/0164346 A1* | 7/2010 | Li | F21S 10/02 313/46 |
| 2012/0052608 A1* | 3/2012 | Yoo | H01L 33/505 438/27 |
| 2012/0127693 A1 | 5/2012 | Lai et al. | |
| 2012/0248479 A1* | 10/2012 | Anc | H01L 33/504 257/98 |
| 2013/0026520 A1 | 1/2013 | Hu et al. | |
| 2014/0097461 A1 | 4/2014 | Ito et al. | |

FOREIGN PATENT DOCUMENTS

| | | |
|---|---|---|
| DE | 102012200327 A1 | 7/2013 |
| DE | 112011103157 T5 | 7/2013 |
| DE | 102013207226 A1 | 10/2014 |
| WO | 2013/088309 A1 | 6/2013 |

\* cited by examiner

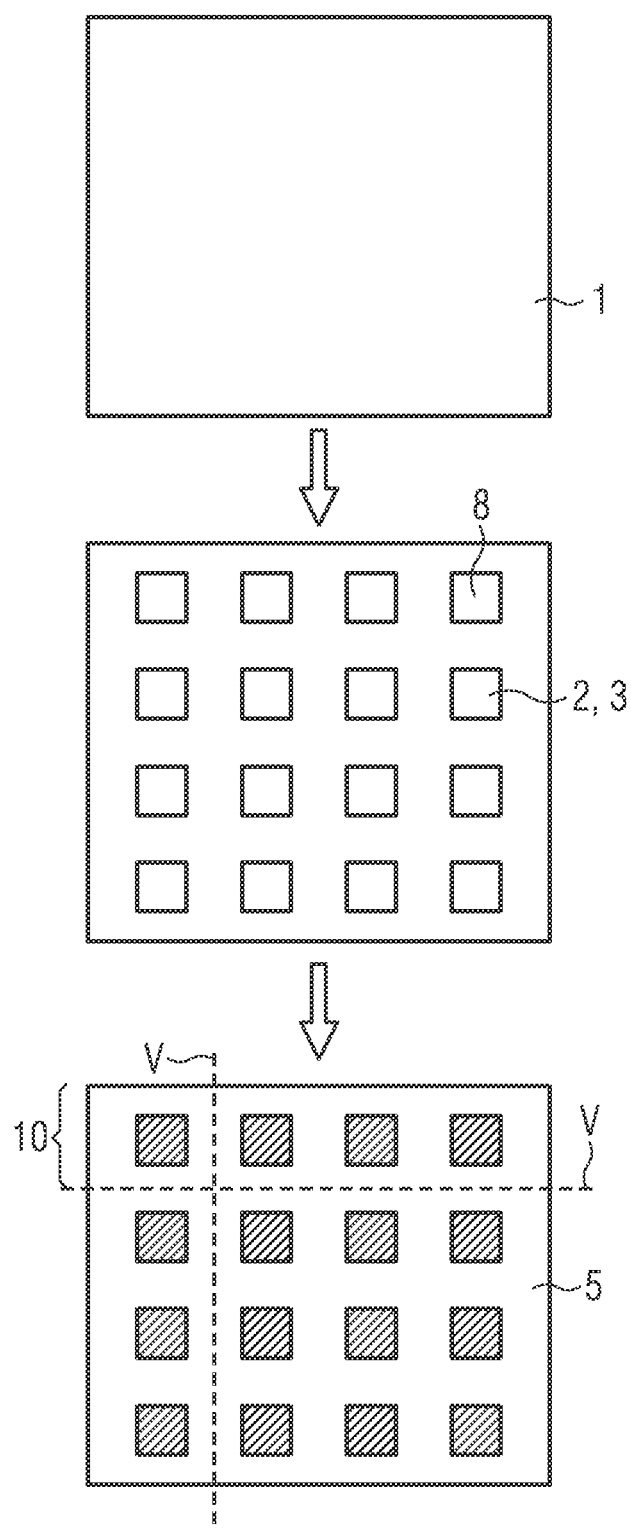

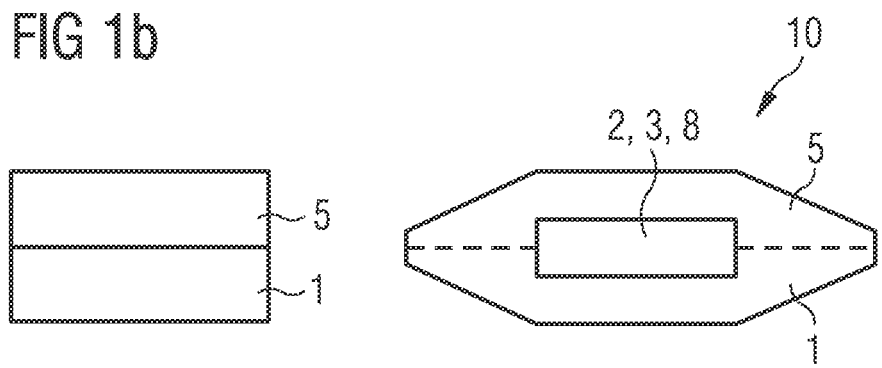

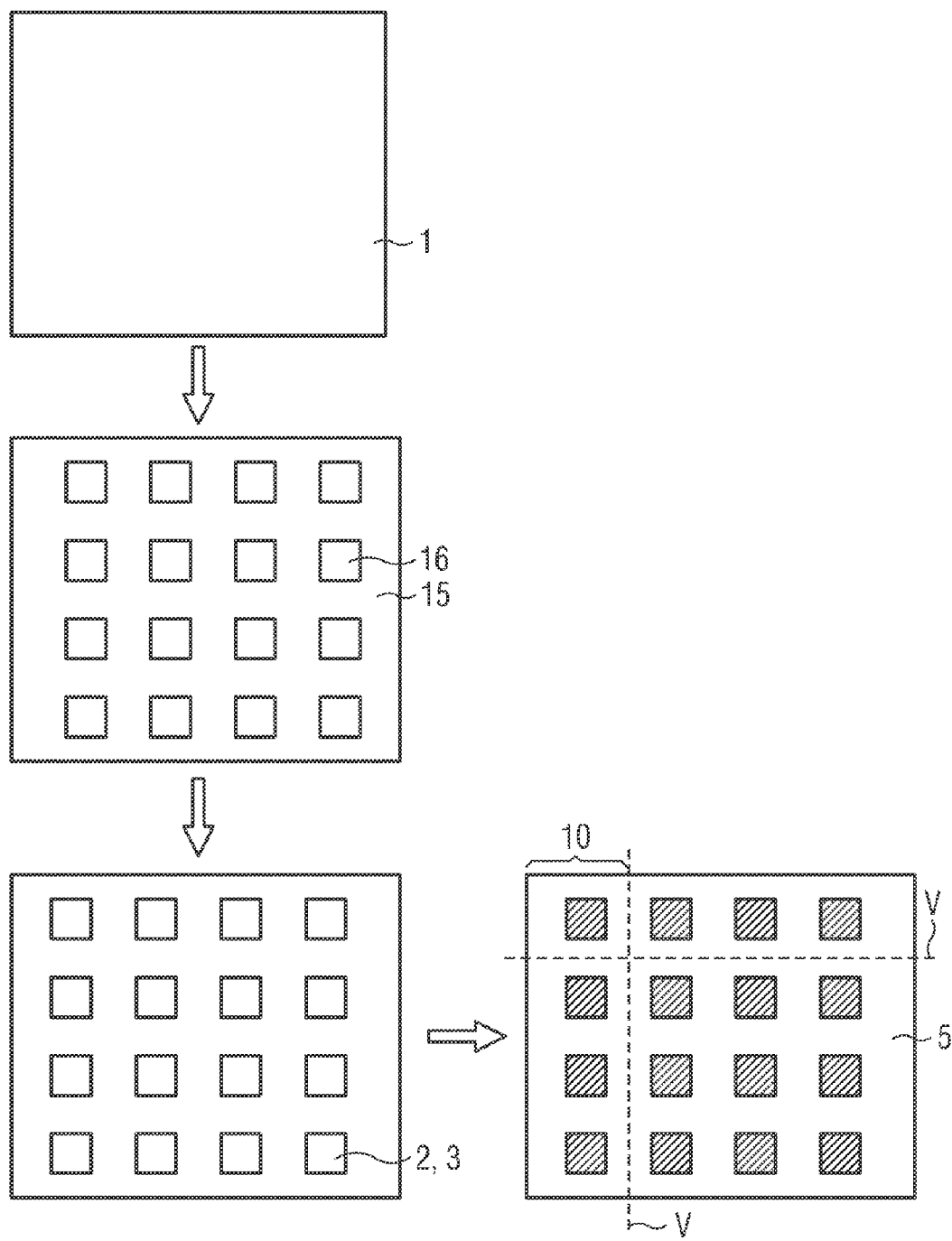

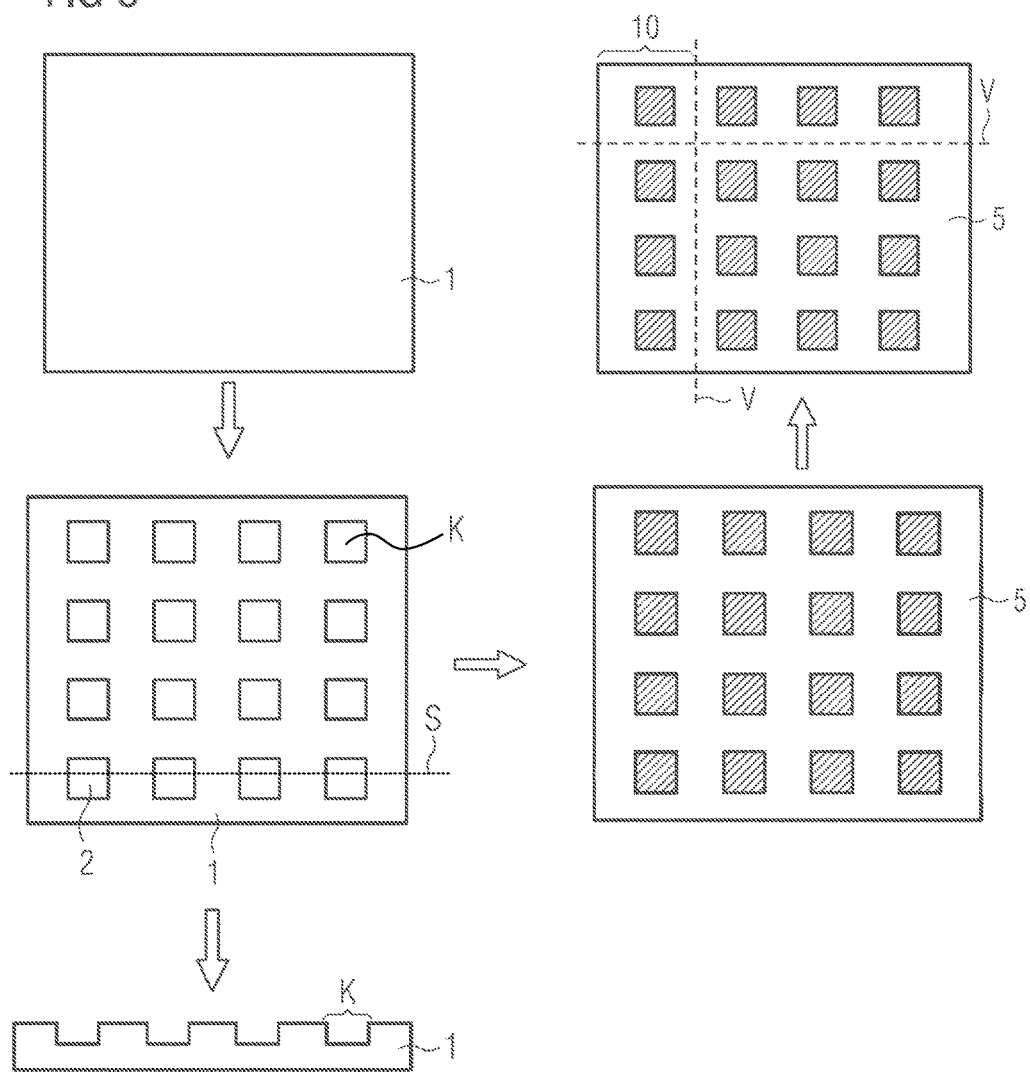

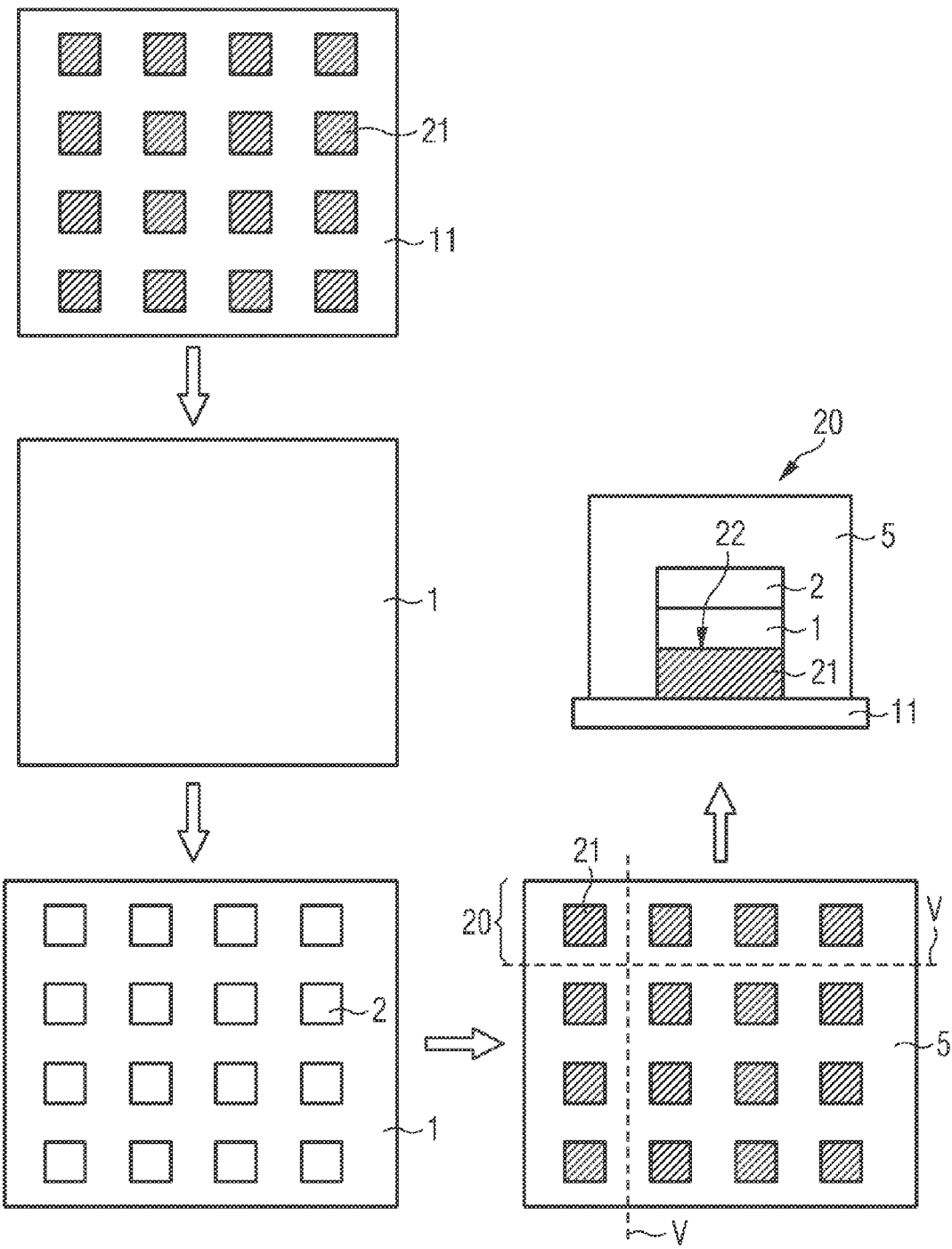

METHODS FOR PRODUCING A PLURALITY OF CONVERSION ELEMENTS, CONVERSION ELEMENT AND OPTOELECTRONIC COMPONENT

The invention relates to a method for producing a plurality of conversion elements, a conversion element and an optoelectronic component.

This patent application claims the priority of German patent application 10 2014 108 362.8, the disclosure of which is incorporated herein by reference.

For the use in screens, conversion components for converting the wavelength of light require a broad color range. New, high-resolution screen displays like 2 k or 4 k (Ultra High Definition) increase the demand of conversion components with broad color ranges. By means of using conversion elements based on conventional converter materials, such as phosphor (pc-LED), the demand for a broad color range is difficult to achieve, however, since conventional converter materials, for example for LEDs, have a broad band emission (such as a bandwidth of greater than 60 nm for the color green and a bandwidth of greater than 70 nm for the color red) and a limited width of an emission maximum. Quantum dot wavelength converters have proved to be advantageous for such an application, as these converters have the property of a narrow band emission (such as a bandwidth of less than 50 nm for the color green and a bandwidth of less than 60 nm for the color red) and a flexibility in the emission maximum.

So far, a direct arrangement of quantum dot wavelength converters on LEDs, in particular a direct arrangement at a level of an LED unit is not possible for reasons of stability.

Producers of common screens use conversion components with quantum dot wavelength converters, which are not directly applied to the light source, such as to the emission surface of an LED, which is also referred to as remote concept. Different types of remote concepts are known, such as Color IQ in glass capillaries for edge lighting or Quantum Dot Enhancement Films (QDEFs) in plate-shape.

The object underlying the invention is to provide an improved method for producing a plurality of conversion elements as well as a conversion element for an optoelectronic component.

This object is achieved by a method and a conversion element according to the independent claims. Advantageous embodiments and further developments of the invention are the subject-matter of the dependent claims.

In a method step of the method for producing a plurality of conversion elements, a carrier substrate is provided. The carrier substrate has for example a rigid consistency, in order to advantageously ensure a mechanically-stable base for further components during the production method. Furthermore, it is also possible to provide the carrier substrate in liquid form and to subsequently cure it. The carrier substrate may advantageously contain a single layer or alternatively a multilayer structure or consist thereof. The multilayer structure contains or consists of, for example, various polymers, such as silicones, epoxide, PET, perylene or polysilazanes, or contains or consists of different inorganic materials, such as $SiO_x$, $SiN_x$, $Al_2O_3$, $TiO_2$ or $ZrO_2$. Furthermore, the multilayer structure may comprise a layer sequence of organic and inorganic materials. The carrier substrate can advantageously also be produced of a thin glass and advantageously has a thickness of 50 µm to 100 µm.

In a further method step of the method, a converter material is introduced into a matrix material. The converter material can be selected depending on the individual application requirement. The converter material is advantageously introduced into the matrix material, wherein the matrix material is for example liquid, and is cured after the introduction of the converter material. To that end, the matrix material is for example a liquid polymeric material such as silicone, acrylate or similar. Subsequently, the matrix material can advantageously be processed with the converter material into a thin plate, with the plate preferably having a thickness of 20 µm to 200 µm. The processing of the matrix material into a thin plate is for example effected by means of slit casting, screen printing, stencil printing or (compression) molding. Subsequently, a singulation of the plate into a plurality of small plates can be effected by means of punching, sawing or cutting with blades or lasers.

In a further method step of the method, the matrix material with the converter material is applied on individual regions of the carrier substrate in a non-continuous pattern. Arranging the matrix material in regions in a non-continuous pattern results in an interrupted arrangement on the carrier substrate. Allocating the regions with the converter material on the carrier substrate can therefore advantageously be adapted to the respective need. Therefore, the shape of a region can correspond to the shape of a radiation surface of a light source, an LED, for example, or a sub region thereof, over which the completed conversion element is to be positioned or attached. This way, an advantageously transparent carrier substrate with converting and non-converting segments can be formed thereon, wherein the arrangement of the segments can advantageously be effected according to the need during production.

In a further method step of the method, a barrier substrate is applied on the matrix material and on the carrier substrate. The barrier substrate may advantageously be applied on the matrix material with the converter material and on the carrier substrate. Here, it is advantageously possible to apply the barrier substrate in an already finished state or to shape it during application, for example the barrier substrate additionally has a rigid consistency or is applied on the matrix material and the carrier substrate in a non-solid form, liquid form, for example, and subsequently cured. A barrier substrate, which is not applied in solid phase on the matrix material or the carrier substrate, can advantageously be changed and adapted in shape and design, for example advantageously a desired shape of the outer surface and/or the edge surfaces can be achieved, during or after application. After applying and advantageously laminating the barrier substrate, the arrangement of barrier substrate, matrix material and carrier substrate can have a plan outer surface facing away from the carrier substrate.

Advantageously, the barrier substrate may contain or consist of an individual layer or alternatively a multilayer structure. The multilayer structure contains or consists of various polymers such as silicones, epoxide, PET, perylene or polysilazanes, or contains or consists of different inorganic materials such as $SiO_x$, $SiN_x$, $Al_2O_3$, $TiO_2$ or $ZrO_2$ or contains or consists of layer sequences of organic or inorganic materials. The barrier substrate can advantageously be produced of thin glass and advantageously has a thickness of 50 µm to 100 µm.

Furthermore, the barrier substrate can advantageously be applied on the matrix material with the converter material and on the carrier substrate in such a way that a three-dimensional, completely encapsulated matrix material results.

In a further method step of the method, the carrier substrate with the matrix material and the barrier substrate is singulized into a plurality of conversion elements along singulation lines, wherein the conversion elements in each case comprise at least one of the regions of the matrix material.

Advantageously, the singulation lines may run across the barrier substrate, the matrix material and the carrier substrate and eventually intersect, for example in the form of a grid. Singulation is effected with singulation methods such as sawing, cutting with blades or lasers or punching. This way, a plurality of conversion elements can advantageously be produced in a simple manner. To that end, the respective conversion elements may for example be configured as small plates, or an elongated strip, advantageously comprising one or multiple converting regions (regions of the matrix material).

The singulized conversion elements can be applied directly on a light-emitting component (such as the emission surface of an LED chip)(by means of bonding, for example) or at a distance (semi-remote) from the light-emitting component, on the housing thereof, for example.

According to one embodiment of the method, the converter material comprises a quantum dot wavelength converter.

Quantum dot wavelength converters are in particular characterized by a high purity of the converted colors. It is therefore possible to achieve a high color purity of individual pixels of a screen. Therefore, a pixel provided with a quantum dot wavelength converter only emits the converted color and not fractions of other colors, by means of which, without using a quantum dot wavelength converter, the color to be emitted would result in mixed color.

Quantum dot wavelength converters have been proven to be advantageous, since they have a narrow band emission (such as a bandwidth of less than 50 nm for the color green and a bandwidth of less than 60 nm for the color red) and flexibility in the width of the emission maximum.

Quantum dot wavelength converters of all types can be introduced into the matrix material.

Furthermore, it is also possible to use matrix materials with advantageously different quantum dot wavelength converters and to apply them in regions of the carrier substrate in a non-continuous pattern. This way, conversion elements having different converter materials in one conversion element can be produced.

According to one embodiment of the method, the barrier substrate is applied on the matrix material and the carrier substrate as a casting.

The casting is advantageously applied in liquid form and subsequently cured. It is advantageously possible here to shape an outer shape of the barrier substrate until it is finally cured, this way, lateral surfaces and/or outer surfaces such as the radiation exit surface can be modelled as needed. The casting may comprise silicones, epoxide, PET, parylenes or polysilazanes, for example.

According to one embodiment of the method, the carrier substrate and the barrier substrate consist of different materials. The carrier substrate and the barrier substrate advantageously have different functions in the finished conversion element. So, the carrier substrate serves as the material through which the light to be converted enters the conversion element, for example, and the barrier substrate serves as the material through which the converted light exits the conversion element, for example. Furthermore, the material of the carrier substrate may have a more rigid consistency than the material of the barrier substrate due to the application of the matrix material with the converter material on the carrier substrate, for reasons of better stability of the conversion element. It is also possible that the carrier substrate has a flexible and bendable consistency in order to form a bendable conversion element.

According to one embodiment of the method, the barrier substrate is deposited on the matrix material and on the carrier substrate from a vapor phase. Applying the barrier substrate from a vapor phase may advantageously be effected by means of processes such as physical or chemical deposition from the vapor phase (PVD, CVD) or similar.

According to one embodiment of the method, the regions are formed in the carrier substrate as cavities.

To this end, it is advantageously possible, that the carrier substrate per se is formed as a layer of, for example, liquid polymer material on a substrate, or comprises such an arrangement, wherein this layer of polymer material can be structured and processed and is subsequently cured, so that cavities for the matrix material result with the converting material. Advantageously, the cavities can be filled with the matrix material. As an alternative thereto, it is also possible to only fill the cavities with the converter material without the matrix material.

According to one embodiment of the method, the application of the matrix material with the converter material is performed by means of a mask, wherein the mask is applied on the carrier substrate.

In this case, the mask can advantageously comprise materials like metals, ceramic or polymers or be formed thereof. Furthermore, it is possible to form the mask by applying a layer on the carrier substrate and in that the regions provided for the matrix material are formed therein prior to or after the application of the mask material. The matrix material is advantageously introduced into the regions of the mask provided to that end, wherein the matrix material is in liquid form, for example, and is cured after the introduction.

According to one embodiment of the method, the mask is once again removed after the application of the matrix material. The removal of the mask is advantageously effected by means of detaching or dissolving the material of the mask. After the removal of the mask, the barrier substrate can advantageously be in direct contact with the carrier substrate, for example casting or surrounding this material together with the matrix material.

According to one embodiment of the method, application of the matrix material is effected under a protective gas atmosphere or vacuum by means of spray coating, dispersion, printing or jetting.

By using protective gas, an undesired impairment by foreign substances, atmospheric gases, for example, can advantageously be prevented and thus a higher purity of the applied material can be achieved.

According to one embodiment of the method, singulation is effected under protective gas or vacuum.

According to one embodiment, the conversion element comprises a carrier substrate, at least one region with a matrix material, wherein a converter material is embedded in the matrix material, and a barrier substrate, wherein the matrix material with the converter material is enclosed between the carrier substrate and the barrier substrate, wherein the conversion element has the shape of a small plate or a strip.

The at least one region of the matrix material is advantageously applied on the carrier substrate with one side and is surrounded by the barrier substrate on the other sides, encapsulated or casted by the barrier substrate, for example, wherein the carrier substrate and the barrier substrate advantageously form two opposite outer surfaces of the conversion element, which are preferably designed as to be planar. The matrix material advantageously completely surrounded with the carrier substrate and the barrier substrate therefore corresponds to a conversion element which is completely, three-dimensionally encapsulated and which can be applied as an autonomous component on further components, such as LED arrangements (spaced from the light-emitting chip, "semi-remote") or directly on emission surfaces of light-emitting chips.

The converter material advantageously comprises a quantum dot wavelength conversion material.

The conversion element advantageously has the shape of a plate or a strip, wherein the conversion element can also have multiple regions having the matrix material, which are advantageously not applied continuously, and on which the barrier substrate is applied.

According to one embodiment, the optoelectronic component comprises at least one semiconductor chip on a connecting plate and at least one conversion element, wherein the at least one semiconductor chip is in each case assigned at least one conversion element.

The at least one conversion element is arranged on the semiconductor chip in such a way that in a plan view on the optoelectronic component, the radiation emitted by the semiconductor chip is at least in part to be considered as the radiation converted by the conversion element. In other words, the conversion element covers the semiconductor chip at least partially. Furthermore, it is also possible that multiple identical or different conversion elements cover one semiconductor chip or that one conversion element covers multiple semiconductor chips. By means of the at least one conversion element, the optoelectronic component has a radiation with a narrow band emission (such as a bandwidth of less than 50 nm for the color green and a bandwidth of less than 60 nm for the color red) and a flexibility in the width of the emission maximum. Compared to common conversion plates, which cover the radiation surface of a light-emitting component as a plate, a more flexible and more accurate coverage of small regions, for example sub-regions of the radiation surface (or of a pixel) is advantageously enabled here. In other words, a conversion element can be arranged precisely at a position selected according to the need, at which light is to be converted. Here, the conversion element is arranged as a small-scaled component, for example individually or in an assembly with further conversion elements.

Furthermore, by the targeted attachment, quantum dot wavelength conversion materials can advantageously be positioned with higher accuracy on the region provided for conversion and therefore saving wavelength conversion materials is possible compared to a conversion plate covering the entire optoelectronic component, as these materials must only be located on the required region.

This way, the at least one conversion element can advantageously be attached on any type of light-emitting optoelectronic component. In their function, such optoelectronic components with conversion elements comprising quantum dot wavelength conversion materials are comparable with pc LEDs (phosphor-converted LEDs), and offer numerous design variations for screens.

According to one embodiment of the optoelectronic component, the conversion element has the shape of a strip and is irradiated by multiple semiconductor chips.

According to one embodiment of the optoelectronic component, the conversion element is directly attached on an emission surface of the assigned semiconductor chip.

The at least one conversion element is advantageously directly attached to the at least one semiconductor chip as an autonomous component. Advantageously, therefore no further material as well as no distance exists between the conversion element and the semiconductor chip. This allows for a construction type that is flat and simple to manufacture. Furthermore, the direct application can save costs for a backlighting (BLU) of the conversion element.

According to one embodiment of the optoelectronic component, the conversion element is spaced from the assigned semiconductor chip and the emission surface thereof.

In an arrangement in which the conversion element is spaced apart from the semiconductor chip, the conversion element can be arranged both inside and outside the optoelectronic component in a direction of radiation of the semiconductor chip and cover this chip at least partially in a plan view from a radiation direction. The distance between the semiconductor chip and the conversion element ("semi remote") is advantageously achieved by the carrier substrate. Furthermore, a barrier substrate can be laminated over the entire arrangement of semiconductor chip, carrier substrate and conversion element. This can be used in Chip-on-Board arrangements, for example. By this spaced arrangement, a conversion can advantageously be achieved in one step (one-step-conversion).

The at least one semiconductor chip can advantageously be fixed on the connecting plate by bonding, soldering or the like. In the case of multiple semiconductor chips, the arrangement on the connecting plate can advantageously be effected in any desired manner. The semiconductor chip is either encapsulated by the carrier substrate, or the carrier substrate is only attached to the semiconductor chip per se. The entire arrangement of connecting plate, semiconductor chip, carrier substrate and matrix material is advantageously encapsulated by the applied barrier substrate.

In the case of multiple semiconductor chips, a plurality of optoelectronic components can be produced by singulation with at least one semiconductor chip and one conversion element in the type of direct or spaced construction as Chip-on-Board, for example.

Further advantages, advantageous embodiments and further developments result from the exemplary embodiments described in the following in conjunction with the Figures.

FIGS. 1a, 2, 3 and 4 show an embodiment of the method for producing a plurality of conversion elements.

FIG. 1b shows a side view of a conversion element.

Like or equal elements are provided with the same reference numerals throughout the figures. The integral parts illustrated in the figures as well as the size ratios between them are not considered to be made to scale.

Figure 5A:
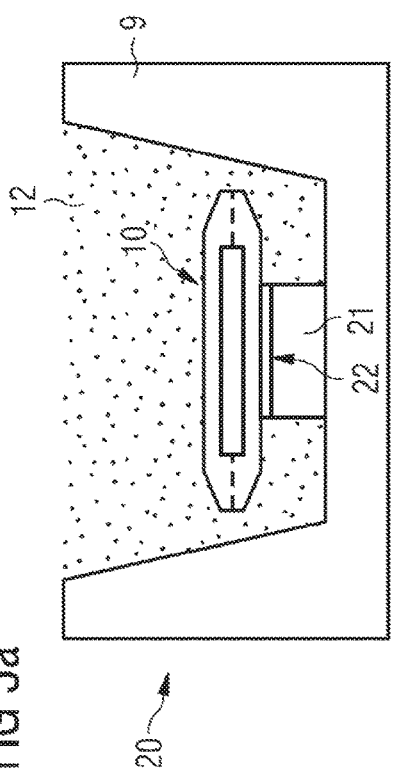
FIGS. 5a, 5b, 5c and 5d show arrangements of conversion elements on optoelectronic components.

FIG. 1a shows a sequence of method steps for producing multiple conversion elements 10 in a plan view. A carrier substrate 1 is provided in the first step. The carrier substrate 1 has a solid consistency and a rectangular layout, in order to serve as a mechanically-stable base for further components during the production method. Furthermore, it is also possible to provide the carrier substrate 1 in liquid form and to subsequently cure it. The carrier substrate 1 may advantageously consist of or contain a single layer or alternatively a multilayer structure. The multilayer structure contains or consists of various polymers, such as silicones, epoxide, PET, perylene or polysilazanes or contains or consists of different inorganic materials, such as $SiO_x$, $SiN_x$, $Al_2O_3$, TiO$_2$ or ZrO$_2$. The multilayer structure may further comprise a layer sequence of organic or inorganic materials. The carrier substrate 1 can advantageously be produced from thin glass and advantageously has a thickness of 50 μm to 100 μm.

In the next method step, multiple non-continuous regions 8 of a matrix material 2 comprising a quantum dot wavelength conversion material 3 are attached to the carrier substrate 1 in a non-continuous pattern. The regions 8 have a square structure, in particular.

The converter material 3 is advantageously introduced into the matrix material 2, wherein the matrix material is liquid, for example, and is cured after the introduction of the converter material. The matrix material 2 is a liquid polymer material such as silicone, acrylate or similar, for example. Subsequently, the matrix material with the converter material can advantageously be processed into a thin plate, wherein the plate has a thickness of 20 μm to 200 μm. Processing the matrix material into a thin plate is effected by means of slit casting, screen printing, stencil printing or compression molding. Subsequently, a singulation of the plate into a plurality of small plates can be effected by means of punching, sawing or cutting with blades or laser.

Allocating the regions 8 on the carrier substrate 1 can therefore advantageously be adapted to the respective need.

In the next method step, a barrier substrate 5 is applied on the matrix material 2 and the carrier substrate 1. Here, it is advantageously possible to apply the barrier substrate 5 in an already finished state or to shape it during application, for example the barrier substrate 5 additionally has a rigid consistency or is applied on the matrix material 2 and the carrier substrate 1 in a non-solid form, liquid form for example, and subsequently cured. A barrier substrate 5, which is not applied in solid phase on the matrix material 2 or the carrier substrate 1, can advantageously be changed and adapted in shape and design after or during application, for example, advantageously a desired shape of the outer surface and/or the edge surface can be achieved. After the application, the barrier substrate 5 is laminated and has an plan outer surface that faces away from the carrier substrate 1.

The carrier substrate 5 may advantageously consist of a single layer or alternatively a multilayer structure or contain such a structure. The multilayer structure contains or consists of, for example, various polymers, such as silicones, epoxide, PET, perylene or polysilazanes, or contains or consists of different inorganic materials, such as SiO$_x$, SiN$_x$, Al$_2$O$_3$, TiO$_2$ or ZrO$_2$ or contains or consists of layer sequences of organic and inorganic materials. The barrier substrate 5 can advantageously be produced of thin glass and advantageously has a thickness of 50 μm to 100 μm.

Preferably, the barrier substrate 5 completely encapsulates the matrix material and the carrier substrate 1, so that the all exposed surfaces of the matrix material are covered by the barrier substrate.

In the next method step, the carrier substrate 1 with the matrix material and barrier substrate 5 is singulized in multiple conversion elements 10 along the singulation lines V, wherein the conversion elements 10 respectively comprise one of the regions 8 of the matrix material.

The singulation lines V run in straight lines parallel to the side surface of the carrier substrate 1 and intersect at right angles.

Singulation is effected by means of singulation methods such as sawing, cutting with blades or lasers or punching. This way, a plurality of conversion elements 10 can advantageously be produced in a simple manner, which elements are shown in a side view in FIG. 1b with the carrier substrate 1 and the barrier substrate 5 and a cross-section through the matrix material 2.

FIG. 2 shows a sequence of method steps for producing multiple conversion elements 10 in a plan view. In addition to the course of the method of FIG. 1a, a mask 15 is applied on the carrier substrate 1 prior to the application of the matrix material 2. The mask 15 advantageously comprises rectangular or squared recesses 16 in which the matrix material 2 is introduced. According to FIG. 1a, after the introduction of the matrix material 2, the barrier substrate 5 is applied on the matrix material 2 and the mask 15. Alternatively, it is possible to remove the mask 15 from the carrier substrate 1 after the matrix material 2 is applied.

FIG. 3 shows a sequence of method steps for producing a plurality of conversion elements 10 in a plan view, in which the carrier substrate 1 has squared cavities K in which the matrix material 2 is introduced, in particular filled in as a liquid material. The shape of the cavities and their arrangement are arbitrary. FIG. 3 also shows a side view of the carrier substrate 1 with the cavities K along a sectional line S.

FIG. 4 shows a sequence of method steps for producing a plurality of conversion elements in a plan view, wherein the conversion elements are additionally arranged on semiconductor chips 21.

In a first method method step, a plurality of semiconductor chips 21 are provided on a connecting plate 11. Here, the semiconductor chips may be arranged in an arbitrary grid on the connecting plate.

In further method steps of the method according to the method of FIG. 1a, a carrier substrate 1, a matrix material 2 and a barrier substrate 5 are provided and applied over the semiconductor chips 21. Here, the matrix material 2 is spaced from the emission surface 22 of the semiconductor chip 21. The distance is selected by the thickness of the carrier substrate 1. Here, the barrier substrate 5 is applied in such a way that it encapsulates the entire arrangement of matrix material 2, carrier substrate 1, semiconductor chip 21 and connecting plate 11.

Singulation along singulation lines V is effected in the next method step, so that a plurality of optoelectronic components 20 with in each case one semiconductor chip 21 on a connecting plate 11 develops. In the last image sequence, FIG. 4 shows a side view of the optoelectronic component 20, in which the spacing of the matrix material 2 to the semiconductor chip 21 and the encapsulation of the matrix material 2, the carrier substrate 1 and the semiconductor chip 21 on the connecting plate 11 can be discerned.

FIG. 5a shows a direct arrangement of a conversion element 10 in an optoelectronic component 20, for example directly on an emission surface 22 of a semiconductor chip 21, wherein the conversion element 10 and the semiconductor chip 21 are casted within a cavity of a housing 9 as a QFN-package, for example.

Figure 5B:
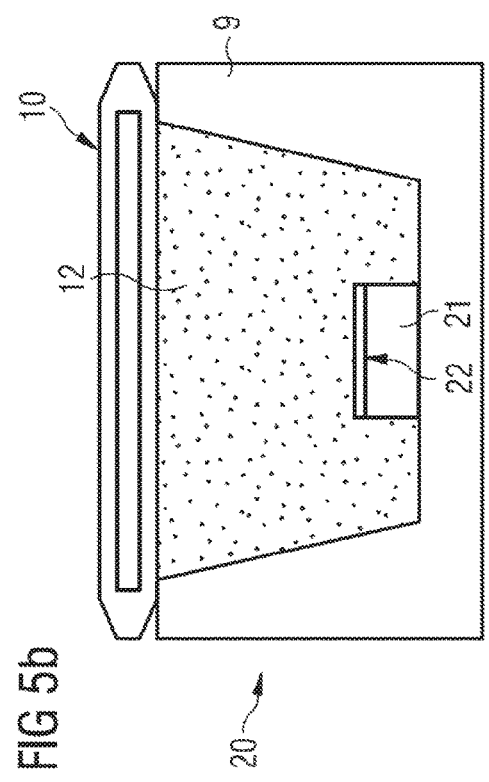

FIG. 5b shows the optoelectronic component 20 according to FIG. 5a, wherein the conversion element 10 is not directly arranged on the semiconductor chip 21, but on the housing 9. A further converter material can be introduced into the casting 12 of the semiconductor chip 21 here.

Figure 5C:
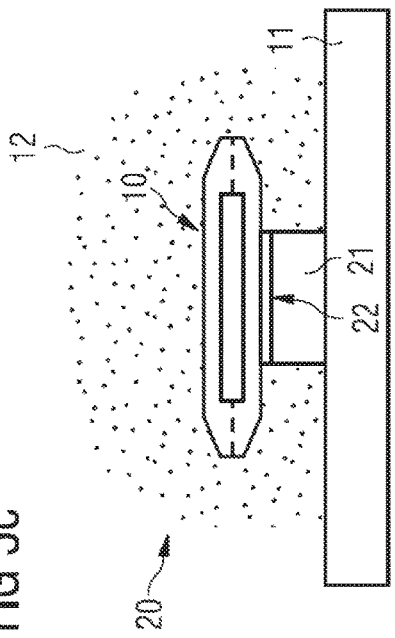

FIG. 5c shows an optoelectronic component 20, wherein the conversion element 10 is attached directly on an emission surface 22 of a semiconductor chip 21 and a casting material 12 encapsulates the conversion element 10 and the semiconductor chip 21, in the shape of a lens, on a connecting plate 11.

Figure 5D:
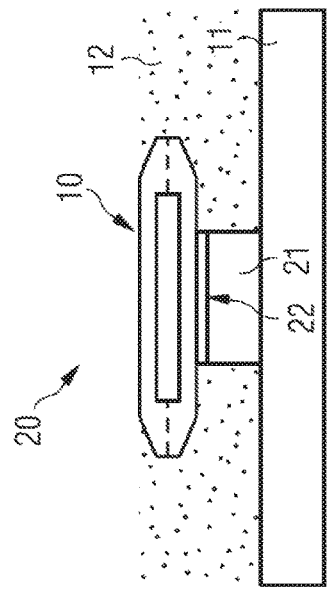

FIG. 5d shows an optoelectronic component 20 according to FIG. 5c, wherein a casting 12 is not formed in the shape of a lens, does not cover a radiation surface of the conversion element 10, and comprises a converter material per se. The optoelectronic component may be designed as a chip-scale package (CSP), for example.

Figure 6:
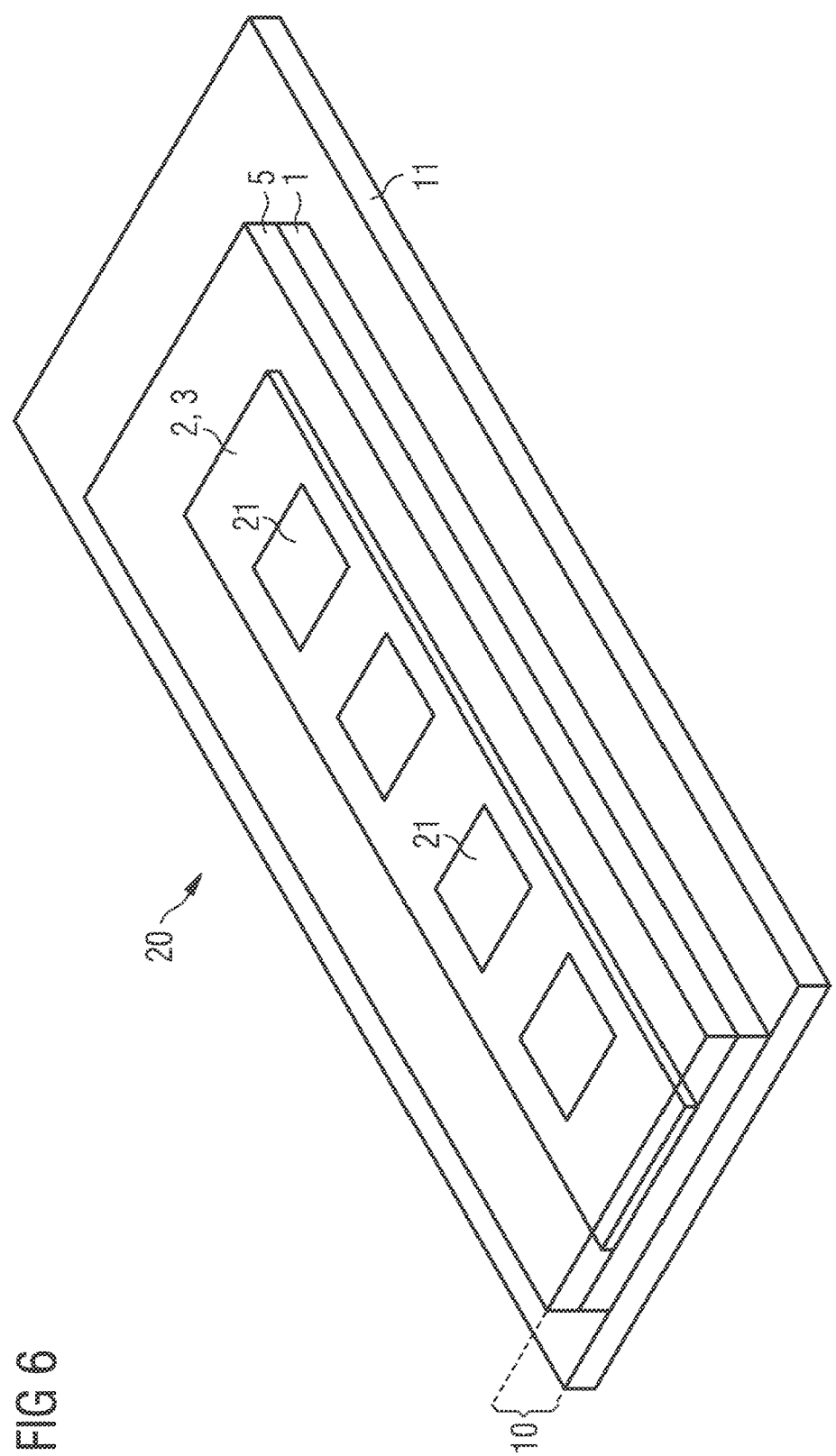
FIG. 6 shows an optoelectronic component with a conversion element.

FIG. 6 shows an optoelectronic component 20 with a multitude of semiconductor chips 21 on a connecting plate 11, wherein the semiconductor chips 21 are covered with a strip-shaped conversion element 10.

The invention is not limited by the description by means of the exemplary embodiments. The invention rather comprises any new feature as well as any combination of features, particularly including any combination of features in the patent claims, even if this combination or this feature per se is not explicitly indicated in the patent claims or the exemplary embodiments.

The invention claimed is:

1. A method for producing a plurality of conversion elements, comprising the following steps:
   providing a carrier substrate;
   introducing a converter material into a matrix material;
   applying the matrix material with the converter material on individual regions of the carrier substrate in a non-continuous pattern, wherein the regions are formed in the carrier substrate as cavities;
   applying a barrier substrate on the matrix material and on the carrier substrate; and
   singulating the carrier substrate with the matrix material and the barrier substrate into a plurality of conversion elements along singulation lines, wherein the conversion elements in each case comprise at least one of the regions of the matrix material.

2. The method according to claim 1, wherein the converter material comprises a quantum dot wavelength converter.

3. The method according to claim 1, wherein the barrier substrate is applied as a casting on the matrix material and the carrier substrate.

4. The method according to claim 1, wherein the carrier substrate and the barrier substrate consist of different materials.

5. The method according to claim 1, wherein the barrier substrate is deposited on the matrix material and on the carrier substrate from a gas phase.

6. The method according to claim 1, wherein the application of the matrix material with the converter material is performed by means of a mask, wherein the mask is applied on the carrier substrate.

7. The method according to claim 6, wherein the mask is removed again after the application of the matrix material.

8. The method according to claim 1, wherein the application of the matrix material is effected under a protective gas atmosphere or vacuum by means of spray coating, dispersion, printing or jetting.

* * * * *